(12) United States Patent
Chiu et al.

(10) Patent No.: US 12,027,096 B2
(45) Date of Patent: Jul. 2, 2024

(54) ELECTRONIC DEVICE

(71) Applicant: Innolux Corporation, Miaoli County (TW)

(72) Inventors: Chan-Feng Chiu, Miaoli County (TW); Ming-Feng Hsieh, Miaoli County (TW); Li-Jin Wang, Miaoli County (TW); Meng-Chang Tsai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/077,199

(22) Filed: Dec. 7, 2022

(65) Prior Publication Data

US 2023/0222956 A1 Jul. 13, 2023

(30) Foreign Application Priority Data

Jan. 7, 2022 (CN) .......................... 202210015851.8

(51) Int. Cl.
*G09G 3/20* (2006.01)
*G09G 3/36* (2006.01)

(52) U.S. Cl.
CPC ......... *G09G 3/2092* (2013.01); *G09G 3/3614* (2013.01); *G09G 3/3648* (2013.01); *G09G 2300/0426* (2013.01); *G09G 2310/0205* (2013.01); *G09G 2310/0267* (2013.01); *G09G 2310/0275* (2013.01)

(58) Field of Classification Search
CPC ............. G09G 3/3614; G09G 2310/08; G09G 2310/0251; G09G 3/3648; G09G 3/3677; G09G 2310/0286
See application file for complete search history.

(56) References Cited

U.S. PATENT DOCUMENTS

| 2014/0168281 A1* | 6/2014 | Ahn | G09G 3/3648 345/99 |
| 2016/0078826 A1* | 3/2016 | Yoo | G09G 3/3648 345/88 |
| 2018/0240423 A1* | 8/2018 | Park | G09G 3/3607 |

FOREIGN PATENT DOCUMENTS

| CN | 106125438 | 11/2016 | |
| TW | 201310429 | 3/2013 | |
| TW | 201312535 | 3/2013 | |
| TW | 201335921 | 9/2013 | |
| TW | 201335921 A * | 9/2013 | ............ H03M 13/01 |

* cited by examiner

*Primary Examiner* — Sanjiv D. Patel
(74) *Attorney, Agent, or Firm* — JCIPRNET

(57) ABSTRACT

An electronic device includes an array substrate. The array substrate includes first to third gate lines, a first to third pixel units, and a gate driving circuit. The third gate line is disposed between the first and second gate lines. The first pixel unit is electrically connected to the first gate line and the data line. The second pixel unit is electrically connected to the second gate line and the data line. The third pixel unit is electrically connected to the third gate line and the data line. The gate driving circuit is electrically connected to the first to third gate lines. The gate driving circuit provides a first gate driving signal to the first pixel unit, a second gate driving signal to the second pixel unit, and a third gate driving signal to the third pixel unit in a time sequence.

20 Claims, 12 Drawing Sheets

ELECTRONIC DEVICE

CROSS-REFERENCE TO RELATED APPLICATION

This application claims the priority benefit of China application serial no. 202210015851.8, filed on Jan. 7, 2022. The entirety of the above-mentioned patent application is hereby incorporated by reference herein and made a part of this specification.

BACKGROUND

Technical Field

The disclosure relates to an electronic device.

Description of Related Art

In some products, the electronic device adopts a layout design of double gate lines to help reduce the usage of data driving circuits. However, there are still some areas for improvement in this design.

SUMMARY

The disclosure provides an electronic device that may provide a good display effect.

According to an embodiment of the disclosure, an electronic device includes an array substrate. The array substrate includes: a first gate line, a second gate line, and a third gate line, and the third gate line is disposed between the first gate line and the second gate line; a data line; a first pixel unit electrically connected to the first gate line and the data line; a second pixel unit electrically connected to the second gate line and the data line; a third pixel unit electrically connected to the third gate line and the data line; and a gate driving circuit electrically connected to the first gate line, the second gate line, and the third gate line, and the gate driving circuit provides a first gate driving signal to the first pixel unit, a second gate driving signal to the second pixel unit, and a third gate driving signal to the third pixel unit in a time sequence.

In order to make the above features and advantages of the disclosure better understood, embodiments are specifically provided below with reference to figures for detailed description as follows.

BRIEF DESCRIPTION OF THE DRAWINGS

The accompanying drawings are included to further understand the disclosure, and the drawings are incorporated in the specification and constitute a part of the specification. The drawings illustrate embodiments of the disclosure and, together with the description, serve to explain principles of the disclosure.

DESCRIPTION OF THE EMBODIMENTS

Figure 1:
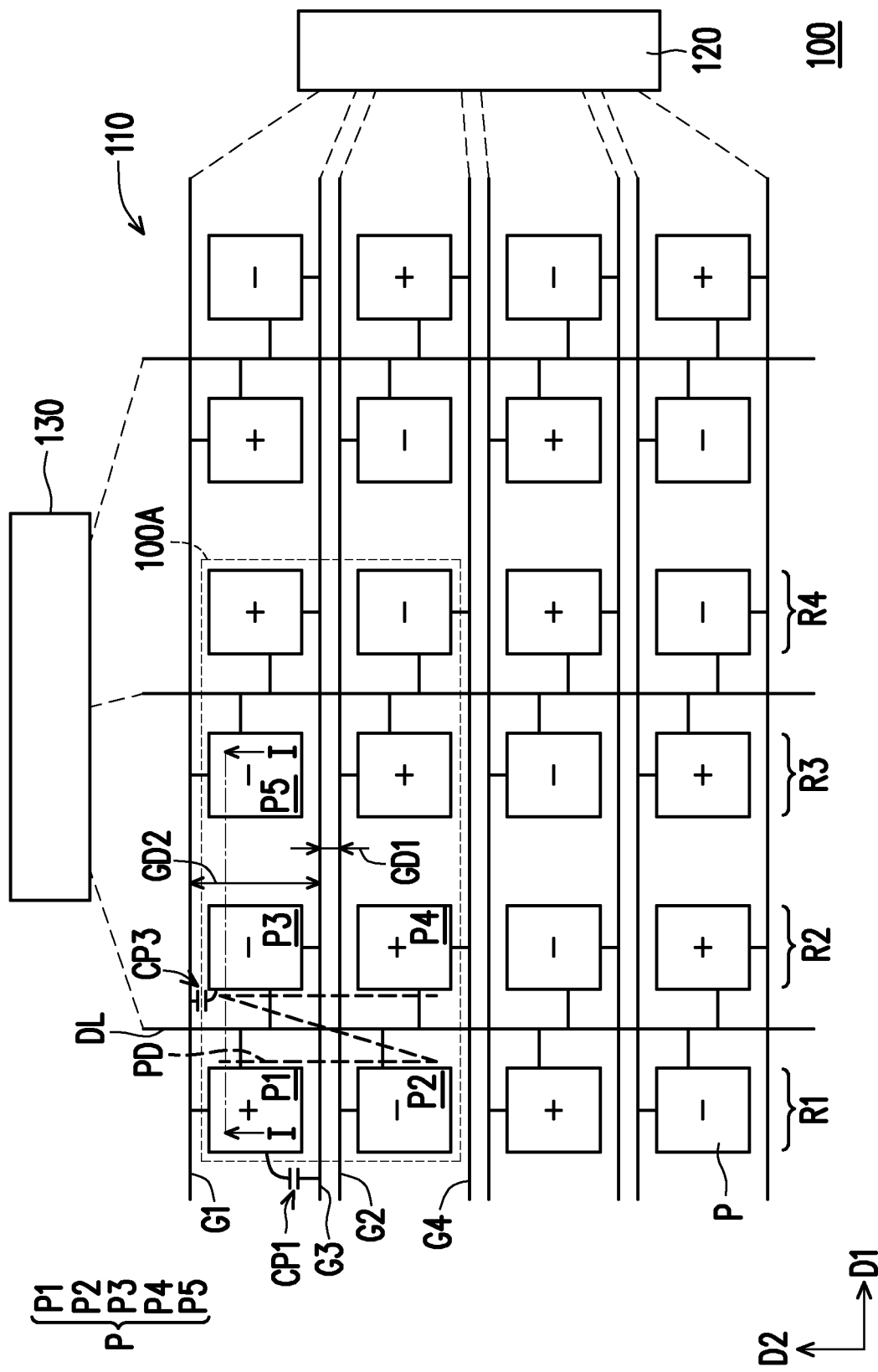
FIG. 1 is a schematic diagram of an electronic device of an embodiment of the disclosure.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

When one structure (or layer, component, substrate) in the disclosure is described to be located on/above another structure (or layer, component, substrate), it may mean that the two structures are adjacent and directly connected, or it may mean that the two structures are adjacent but not directly connected, and indirect connection means that there is at least one intermediate structure (or intermediate layer, intermediate component, intermediate substrate, intermediate spacing) between the two structures. The lower surface of one structure is adjacent or directly connected to the upper surface of the intermediate structure, the upper surface of the other structure is adjacent or directly connected to the lower surface of the intermediate structure, and the intermediate structure may be formed by a single-layer or multi-layer physical structure or non-physical structure without limitation. In the disclosure, when a certain structure is disposed "on" another structure, it may mean that a certain structure is "directly" on the other structure, or that a certain structure is "indirectly" on the other structure. That is, at least one structure is further sandwiched between the certain structure and the other structure.

The electrical connection or coupling described in the present disclosure may refer to direct connection or indirect connection. In the case of direct connection, the endpoints of the components on two circuits are directly connected or connected to each other by a conductive line segment. In the case of indirect connection, there are switches, diodes, capacitors, inductors, resistors, other suitable components, or a combination of the components between the endpoints of the components on the two circuits, but is not limited thereto.

In the present disclosure, the thickness, length, and width may be measured using an optical microscope, and the thickness may be measured from a cross-sectional image in an electron microscope, but is not limited thereto. In addition, there may be a certain error in any two values or directions for comparison. If the first value is equal to the second value, it implies that there may be an error of about 10% or 5% or 3% between the first value and the second value.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily.

FIG. 1 is a schematic diagram of an electronic device of an embodiment of the disclosure. In FIG. 1, an electronic device 100 includes an array substrate 110. The array substrate 110 includes a first gate line G1, a second gate line G2, and a third gate line G3, and further includes a data line DL, a first pixel unit P1, a second pixel unit P2, a third pixel unit P3, and a gate driving circuit 120. The third gate line G3 is disposed between the first gate line G1 and the second gate line G2. The first pixel unit P1 is electrically connected to the first gate line G1 and the data line DL, the second pixel unit P2 is electrically connected to the second gate line G2 and the data line DL, and the third pixel unit P3 is electrically connected to the third gate line G3 and the data line DL. The gate driving circuit 120 is electrically connected to the first gate line G1, the second gate line G2, and the third gate line G3. Moreover, the gate driving circuit 120 provides a first gate driving signal to the first pixel unit P1, provides a second gate driving signal to the second pixel unit P2, and provides a third gate driving signal to the third pixel unit P3 in a time sequence. In the present embodiment, the array substrate 110 may further include a data driving circuit 130. The data driving circuit 130 is electrically connected to the data line DL to provide a first data signal for the first pixel unit P1 and provide a second data signal for the second pixel unit P2.

As shown in FIG. 1, the array substrate 110 may include a plurality of circuits, and the circuits extended along a first direction D1 may include gate lines, such as the first gate line G1, the second gate line G2, and the third gate line G3, and the circuits extended along a second direction D2 may include the data line DL. The first direction D1 is different from the second direction D2. In some embodiments, the first direction D1 and the second direction D2 may be perpendicular to each other, but not limited thereto. In the present embodiment, the first gate line G1, the third gate line G3, and the second gate line G2 are three gate lines on the array substrate 110 that are sequentially adjacent to each other. Therefore, there are no other gate lines (circuits for transmitting gate driving signals) between the first gate line G1 and the third gate line G3, and there are no other gate lines (circuits for transmitting gate driving signals) between the third gate line G3 and the second gate line G2.

In addition, the array substrate 110 may include a plurality of pixel units P arranged in an array along the first direction D1 and the second direction D2. Hereinafter, the first pixel unit P1, the second pixel unit P2, and the third pixel unit P3 in the pixel units P are described first. In the present embodiment, the first pixel unit P1 and the third pixel unit P3 are disposed adjacent to each other along the first direction D1. The first pixel unit P1 and the third pixel unit P3 may be located between the first gate line G1 and the third gate line G3, and the first pixel unit P1 and the third pixel unit P3 may be located on two opposite sides of the data line DL. The first pixel unit P1 and the second pixel unit P2 are adjacently disposed along the second direction D2. Both the third gate line G3 and the second gate line G2 are located between the first pixel unit P1 and the second pixel unit P2, and the first pixel unit P1 and the second pixel unit P2 are located on the same side of the data line DL. In the present embodiment, a distance GD1 between the third gate line G3 and the second gate line G2 along the second direction D2 is less than a distance GD2 between the third gate line G3 and the first gate line G1 along the second direction D2.

The first pixel unit P1 and the third pixel unit P3 are located on two opposite sides of the data line DL, but are both electrically connected to the data line DL. At the same time, the first pixel unit P1 is electrically connected to the first gate line G1 and the third pixel unit P3 is electrically connected to the third gate line G3. In some embodiments, each of the first pixel unit P1, the second pixel unit P2, and the third pixel unit P3 may include an active component (not shown) and a pixel electrode (not shown) connected to the active component, and the active element may be, for example, a transistor, and the active component may include a gate, a source, and a drain. The gate may be connected to the corresponding gate line, and the drain may be connected to the corresponding data line. For example, the gate of the first pixel unit P1 may be connected to the corresponding gate line G1, and the drain may be connected to the corresponding data line DL. In some embodiments, when the electronic device 100 is used to provide a display function, the electrical signal of the pixel electrode may be used to drive the display layer or the light-emitting material to present the brightness to be displayed. In the first pixel unit P1, the gate of the active component is connected to the first gate line G1 and the source is connected to the data line DL, and in the third pixel unit P3, the gate of the active component is connected to the third gate line G3 and the source is connected to the data line DL. In addition, in the second pixel unit P2, the gate of the active component is connected to the second gate line G2 and the source is connected to the data line DL. In the present embodiment, the first gate line G1 and the third gate line G3, the data line DL, and the first pixel unit P1 and the third pixel unit P3 may form a layout of a double gate line sharing data line (2G1D).

Figure 2:
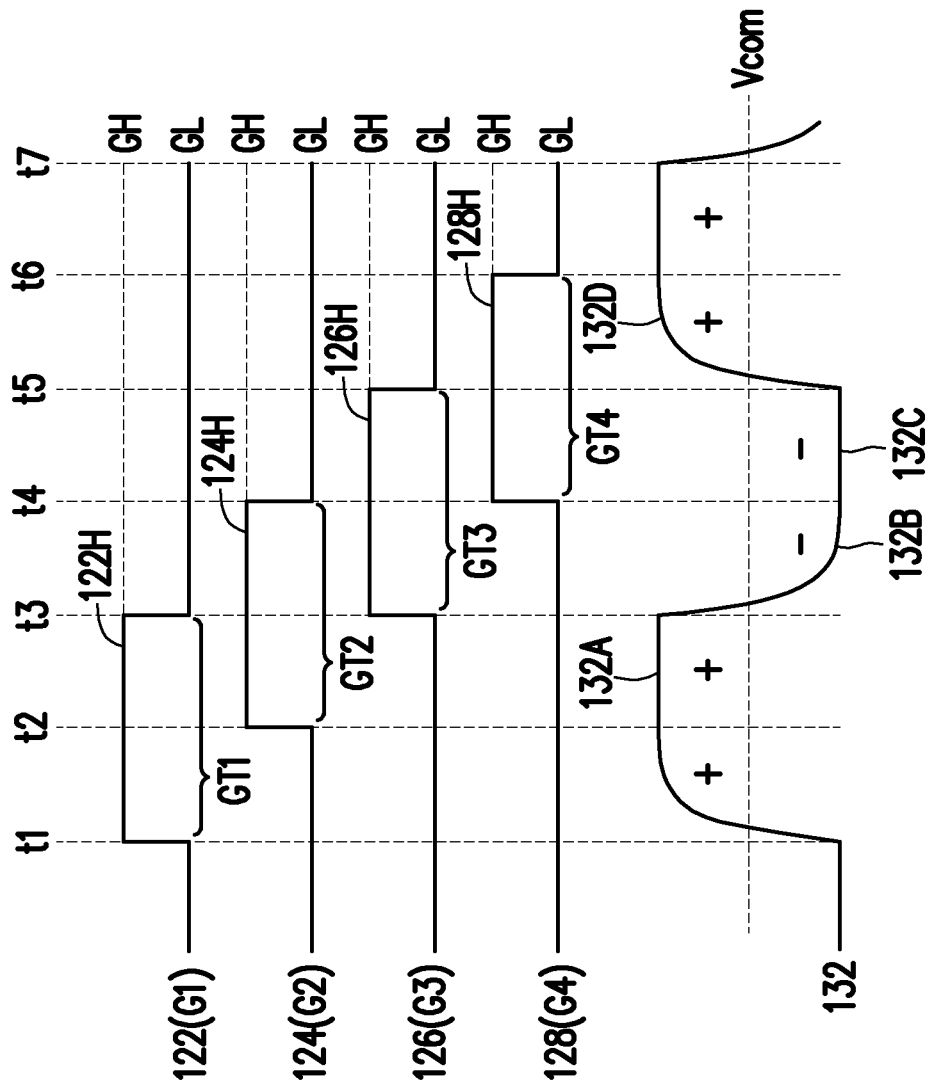
FIG. 2 is a schematic diagram of a partial driving waveform of an electronic device of an embodiment of the disclosure.

FIG. 2 is a schematic diagram of waveforms of some driving signals of an electronic device of an embodiment of the disclosure. For ease of explanation, FIG. 2 presents the gate driving signals of the first gate line G1, the second gate line G2, the third gate line G3, and a fourth gate line G4 and the data signals of the data line DL in FIG. 1, wherein the gate driving signals may be provided to the first gate line G1, the second gate line G2, the third gate line G3, and the fourth gate line G4 by the gate driving circuit 120, and the data signal may be provided to the data line DL by the data driving circuit 130. Here, for the convenience of description, the driving waveforms of the first pixel unit P1, the second pixel unit P2, the third pixel unit P3, and a fourth pixel unit P4 are described. The fourth pixel unit P4 is electrically connected to the fourth gate line G4 and the data line DL. The fourth pixel unit P4 and the second pixel unit P2 are disposed adjacent to each other in the first direction D1. The fourth pixel unit P4 and the third pixel unit P3 are disposed adjacent to each other in the second direction D2. The fourth pixel unit P4 and the second pixel unit P2 are located on two opposite sides of the data line DL. In addition, the fourth pixel unit P4 and the second pixel unit P2 are located between the second gate line G2 and the fourth gate line G4. The second gate line G2 and the third gate line G3 are located between the fourth pixel unit P4 and the third pixel unit P3.

Referring to FIG. 1 and FIG. 2, the driving method of the electronic device 100 includes providing a first gate signal waveform 122, a second gate signal waveform 124, a third gate signal waveform 126, and a fourth gate signal waveform 128 via the gate driving circuit 120 respectively to the first gate line G1, the second gate line G2, the third gate line G3, and the fourth gate line G4; and providing a data signal waveform 132 to the data line DL via the data driving circuit 130.

The first gate signal waveform 122, the second gate signal waveform 124, the third gate signal waveform 126, and the fourth gate signal waveform 128 are oscillated between a high level GH and a low level GL, respectively. A first gate driving signal 122H having the high level GH may turn on the active component of the first pixel unit P1, a second gate driving signal 124H having the high level GH may turn on the active component of the second pixel unit P2, a third gate driving signal 126H having the high level GH may turn on the active component of the third pixel unit P3, and a fourth gate driving signal 128H having the high level GH may turn on the active component of the fourth pixel unit P4. During a frame period, the first gate line G1 is always maintained at the low level GL except for the first gate driving signal 122H, the second gate line G2 is always maintained at the low level GL except for the second gate driving signal 124H, the third gate line G3 is always maintained at the low level GL except for the third gate driving signal 126H, and the fourth gate line G4 is always maintained at the low level GL except for the fourth gate driving signal 128H.

The first gate driving signal 122H may pre-scan the active component of the first pixel unit P1 during the period from time t1 to time t2, and during the period from time t2 to time t3, the gate of the active component of the first pixel unit P1 is maintained at the high level GH. Therefore, a first driving time GT1 of the first gate driving signal 122H may last from time t1 to time t3. The second gate driving signal 124H may be provided to the second gate line G2 from time t2 to time t3 to pre-scan the active component of the second pixel unit P2, and last at the high level GH until time t4. Therefore, a second driving time GT2 of the second gate signal waveform 124 may be extended from time t2 to time t4. According to some embodiments, as shown in FIG. 2, the first driving time GT1 of the first gate driving signal 122H and the second driving time GT2 of the second gate driving signal 124H may be at least partially overlapped. In some embodiments, the overlap ratio of the first driving time GT1 of the first gate driving signal 122H and the second driving time GT2 of the second gate driving signal 124H may be, for example, between 10% and 90%, such as between 10% and 60%, such as between 40% and 60%, such as between 45% and 65%, but not limited thereto. The above overlap ratio is based on the first driving time GT1 being 100%. Similarly, a third driving time GT3 of the third gate driving signal 126H may be from time t3 to time t5, and a fourth driving time GT4 of the fourth gate driving signal 128H may be from time t4 to time t6.

The level of the data signal waveform 132 may be changed according to the effect to be presented (e.g., the brightness of the pixel unit). The data signal waveform 132 in FIG. 2 is for illustration only, and is not intended to limit the disclosure. In the present embodiment, the data signal waveform 132 on the data line DL includes a first data signal 132A, a second data signal 132B, a third data signal 132C, and a fourth data signal 132D. Referring to FIG. 1 and FIG. 2, the first pixel unit P1 is pre-scanned from time t1 to time t2 of the first driving time GT1, so that the first gate driving signal 122H of the first gate line G1 turns on the active component of the first pixel unit P1. During the period from time t2 to time t3 of the first driving time GT1, the active component of the first pixel unit P1 is actually turned on, for example, the gate of the active component is already maintained at the high level GH, so that the first data signal 132A is written into the first pixel unit P1 from time t2 to time t3. During the period from time t2 to time t3 of the second driving time GT2, the second pixel unit P2 is pre-scanned to turn on the active component of the second pixel unit P2. During the period from time t3 to time t4 of the second driving time GT2, the first gate line G1 already has the low level GL, and the gate of the active component of the second pixel unit P2 has the high level GH. Therefore, the second data signal 132B may be written into the second pixel unit P2. Next, at the third drive time GT3, the third pixel unit P3 is also subjected to a similar operation so that the third data signal 132C is written into the third pixel unit P3 during time t4 to time t5 of the third driving time GT3. The fourth pixel unit P4 is also written with the fourth data signal 132D under the fourth gate driving signal 128H during time t5 to time t6 of the fourth driving time GT4. As such, under the driving of the first gate driving signal 122H, the second gate driving signal 124H, the third gate driving signal 126H, and the fourth gate driving signal 128H, as shown in FIG. 1, the first pixel unit P1, the second pixel unit P2, the third pixel unit P3, and the fourth pixel unit P4 are updated along an inverted N-shaped path PD.

In the present embodiment, the first pixel unit P1 and the third pixel unit P3 are located between the first gate line G1 and the third gate line G3. According to FIG. 2, at time t3, the signal writing of the first pixel unit P1 is terminated, and at the same time, the third gate line G3 adjacent to the first pixel unit P1 is at the low level GL. Therefore, the level of the first pixel unit P1 and the low level GL of the third gate line G3 may establish a parasitic capacitance CP1 associated with the first pixel unit P1. After time t3, since the third gate line G3 is at the low level GL most of the time in the picture period as at time t3, the signal written in the first pixel unit P1 is not significantly shifted or floated. Therefore, the luminance presented by the first pixel unit P1 may be kept stable during the picture period. Likewise, at time t5, the first gate line G1 adjacent to the third pixel unit P3 is at the low level GL. Therefore, at time t5, although a parasitic capacitance CP3 is established between the first gate line G1 and the third pixel unit P3, the written signal of the third pixel unit P3 is not significantly shifted or floated due to the level change of the first gate line G1. Moreover, the second gate line G2 pre-scans the second pixel unit P2 between time t2 and time t3 of the second driving time GT2, and thus has the high level GH at time t3. However, since the third gate line G3 exists between the second gate line G2 and the first pixel unit P1, the second gate line G2 has no significant capacitive coupling effect on the first pixel unit P1. Therefore, the second gate line G2 having the high level GH at time t3 does not substantially readily cause the signal of the first pixel unit P1 to shift or float. In general, when the electronic device 100 is used for displaying a picture, the display brightness of the first pixel unit P1 and the third pixel unit P3 may be kept stable. Similarly, other pixel units P may also all maintain stable brightness.

In FIG. 1, the plurality of pixel units P on the array substrate 110 may be used to present different colors. For example, the colors displayed by the plurality of pixel units P on the array substrate 110 include red, green, and blue, but are not limited thereto. In some embodiments, adjacent pixel units P in the second direction D2 may be used to present the same color. For example, the first pixel unit P1 and the second pixel unit P2 are of the same color. In some embodiments, adjacent pixel units P in the second direction D2 may be used to represent the same color, and adjacent pixel units P in the first direction D1 may be used to present different colors. For example, the first pixel unit P1 and the second pixel unit P2 are of the same color, and the first pixel unit P1 and the third pixel unit P3 are of different colors. In the present embodiment, the pixel units P arranged in a column in the second direction D2 may display the same color. The electronic device 100 may provide pixel units P of three colors, and the pixel units P of the three colors are sequentially and repeatedly arranged along the first direction D1. For example, the pixel units P in a first column R1 display the first color, the pixel units P in a second column R2 display the second color, the pixel units P in a third column R3 display the third color, and the pixel units P in a fourth column R4 display the first color. However, the color configuration of the pixel units P is not limited thereto.

In the present embodiment, the level of the data signal waveform 132 may be divided into a positive polarity signal or a negative polarity signal, for example, based on a shared signal value Vcom. For example, a signal having a level higher than the shared signal value Vcom is a positive polarity signal, and a signal having a level lower than the shared signal value Vcom is a negative polarity signal. As shown in FIG. 1 and FIG. 2, the first data signal 132A and the second data signal 132B may have opposite polarities. For example, the first data signal 132A has positive polarity, the second data signal 132B has negative polarity, the third data signal 132C has negative polarity, and the fourth data signal 132D has positive polarity. Since the level difference between signals of different polarities is greater, the level on the data line DL may not necessarily reach the expected level immediately when the polarity of the signal is converted. For example, at time t3, the level on the data line DL may not directly drop from the first data signal 132A of positive polarity to the second data signal 132B of negative polarity. Similarly, at time t5, the conversion of the third data signal 132C and the fourth data signal 132D also has a similar situation. In this way, the data signal written into the corresponding pixel unit P after the polarity conversion may be slightly different from the expected signal. In the present embodiment, the second pixel unit P2 and the fourth pixel unit P4 are pixel units P into which data signals are written after polarity conversion. Therefore, in some embodiments, the luminance to be presented by the second pixel unit P2 and the fourth pixel unit P4 may not be as expected. This results in bright streaks or dark streaks along the first direction D1. In some embodiments, the above phenomenon of bright streaks or dark streaks may be alleviated by adjusting the driving waveform. For example, the long segment of the driving time and the output time of the corresponding data signal may be adjusted via driving control, so that the time for the second pixel unit P2 and the fourth pixel unit P4 to be written with the data signal is elongated, in order to ensure that the second pixel unit P2 and the fourth pixel unit P4 may have predetermined levels to be presented.

In the present embodiment, the second pixel unit P2 and the third pixel unit P3 are used to display different colors and are updated in sequence, but their corresponding driving times are overlapped (for example, from time t3 to time t4), which may cause display color mixing. The display color mixing described here may be understood as the third pixel unit P3 may be written with the data signal of the second pixel unit P2. However, the first pixel unit P1 and the second pixel unit P2 are used to display the same color, and the issue of display color mixing does not occur, as is also the case with the third pixel unit P3 and the fourth pixel unit P4. Therefore, the display color mixing issue caused by the driving sequence of the electronic device 100 is less significant. For example, among the first pixel unit P1, the second pixel unit P2, the third pixel unit P3, and the fourth pixel unit P4, the third pixel unit P3 has a display color mixing issue.

Figure 7:
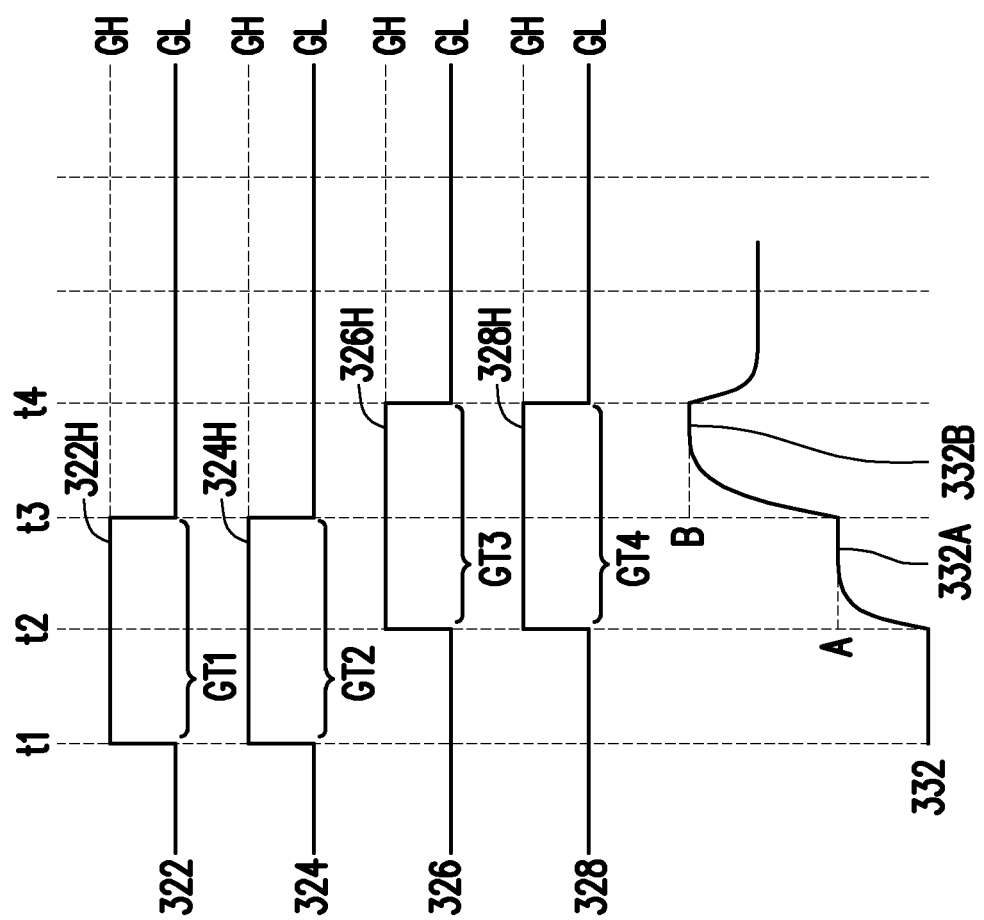

In some embodiments, the first gate line G1 and the third gate line G3 are adjacent to the first pixel unit P1. Also, the first gate line G1 and the third gate line G3 are adjacent to each other, that is, there is no other gate line between the first gate line G1 and the third gate line G3. In some embodiments, the first driving time GT1 of the first gate line G1 and the third driving time GT3 of the third gate line G3 may be designed not to overlap. In this way, as shown in FIG. 2, during the first driving time GT1 of driving the first pixel unit P1, the third gate line G3 adjacent to the first pixel unit P1 has no electrical change. Therefore, the parasitic capacitance CP1 generated by the third gate line G3 during the first driving time GT1 does not readily affect the first pixel unit P1. That is, the signal change of the third gate line G3 in the picture period does not readily change the written signal of the first pixel unit P1, or has very little disturbance to the written signal of the first pixel unit P1. Therefore, the parasitic capacitance CP1 is generated by the capacitive coupling between the third gate line G3 and the first pixel unit P1, and the influence on the signal written in the first pixel unit P1 may be reduced. In some embodiments, the first driving time GT1 of the first gate line G1 and the third driving time GT3 of the third gate line G3 may be designed to be partially overlapped, as shown in FIG. 7. Similarly, the influence of the parasitic capacitance CP1 generated by the third gate line G3 on the written signal of the first pixel unit P1 may be reduced. In some embodiments, the overlap ratio of the first driving time GT1 of the first gate line G1 and the third driving time GT3 of the third gate line G3 may be, for example, less than 50%, and may be, for example, between 0% and 70%, such as between 0% and 50%, such as between 0.1% and 30%, but not limited thereto. The above overlap ratio is based on the first driving time GT1 being 100%.

Figure 3:
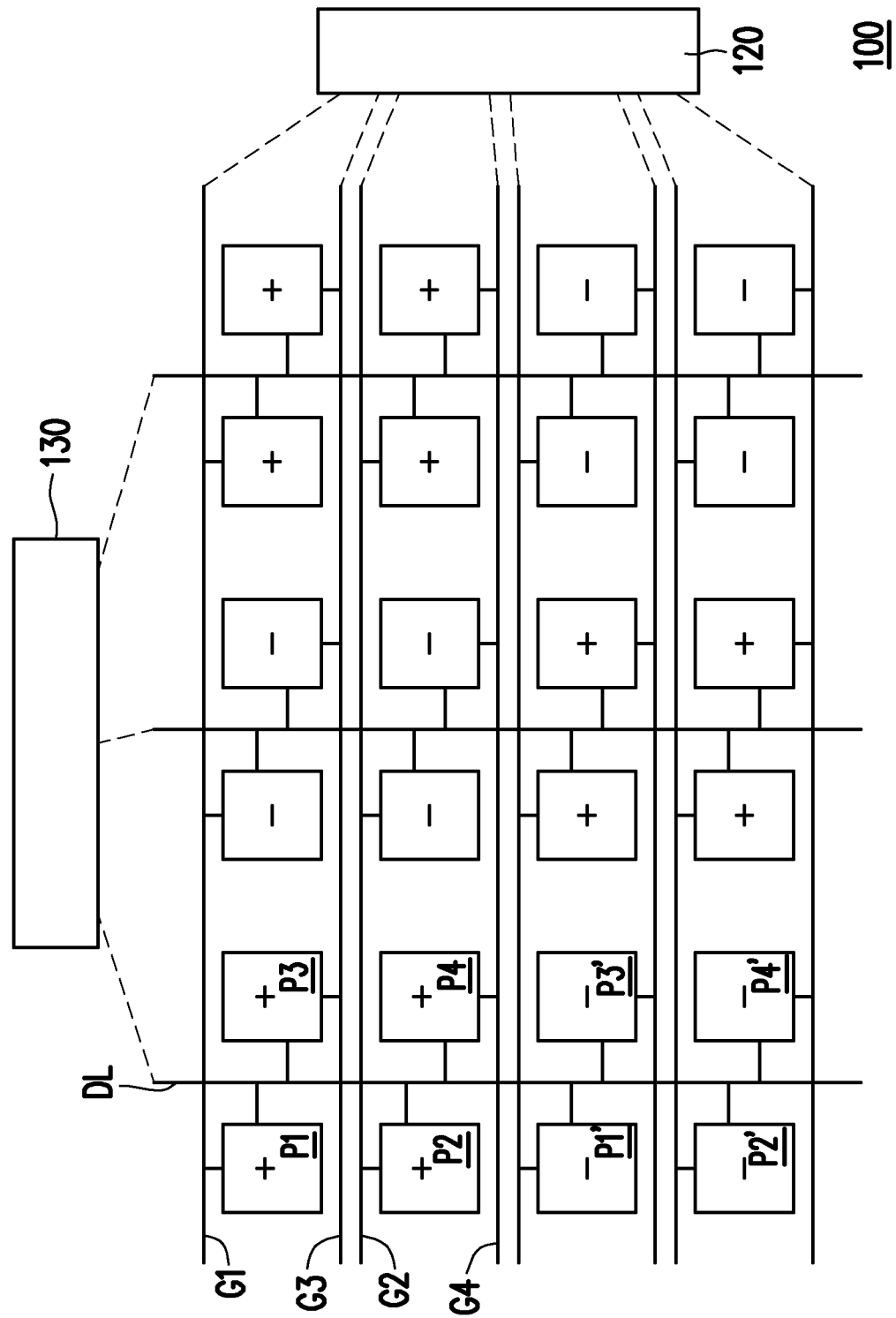
FIG. 3 and FIG. 4 are a schematic diagram and a driving waveform diagram of an electronic device of an embodiment of the disclosure.
Figure 4:
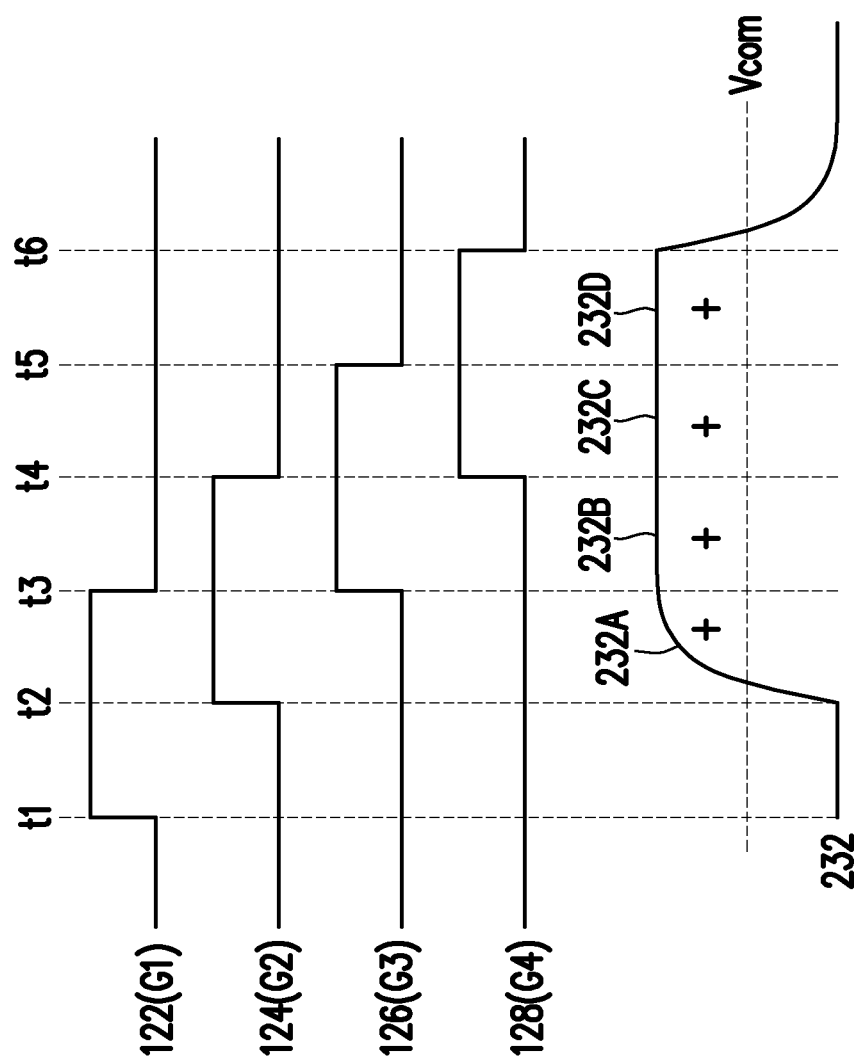

FIG. 3 and FIG. 4 are a schematic diagram and a driving waveform diagram of an electronic device of an embodiment of the disclosure. The electronic device 100 of FIG. 3 is substantially similar to the electronic device 100 of FIG. 1, but FIG. 3 shows a schematic diagram of the electronic device 100 driven by the driving waveform of FIG. 4. The same components in the two embodiments are all represented by the same reference numerals, and are not repeated herein. The present embodiment differs from the embodiments of FIG. 1 and FIG. 2 in that the shape of a data signal waveform 232 is provided by the data driving circuit 130. Specifically, the data signal waveform 232 includes a first data signal 232A written into the first pixel unit P1, a second data signal 232B written into the second pixel unit P2, a third data signal 232C written into the third pixel unit P3, and a fourth data signal 232D written into the fourth pixel unit P4. Here, the first data signal 232A and the second data signal 232B have the same polarity. For example, the first data signal 232A, the second data signal 232B, the first data signal 232C, and the fourth data signal 232D have a high level compared to the shared signal value Vcom and are all positive polarity signals.

In the present embodiment, the other four pixel units in the electronic device 100 may be denoted as a first pixel unit P1', a second pixel unit P2', a third pixel unit P3', and a fourth pixel unit P4'. The driving method of the first pixel unit P1', the second pixel unit P2', the third pixel unit P3', and the fourth pixel unit P4' is the same as the driving method of the first pixel unit P1, the second pixel unit P2, the third pixel unit P3, and the fourth pixel unit P4. However, the data signals written into the first pixel unit P1', the second pixel unit P2', the third pixel unit P3', and the fourth pixel unit P4', for example, all have the same polarity, such as negative polarity. Thus, in one picture period, among the first pixel unit P1', the second pixel unit P2', the third pixel unit P3', and the fourth pixel unit P4', the first pixel unit P1' is affected by the polarity inversion of the data signal. Similarly, among the first pixel unit P1 to the fourth pixel unit P4, the first pixel unit P1 may be affected by the polarity inversion of the data signal. In other words, the polarity inversion of the electronic device 100 occurs after the four pixel units are updated, thus helping to reduce the number of pixel units where bright streaks or dark streaks may occur in the electronic device 100. For example, the bright streaks or dark streaks caused by the polarity inversion of the data signal are distributed in dots in the picture displayed by the electronic device 100.

Figure 5:
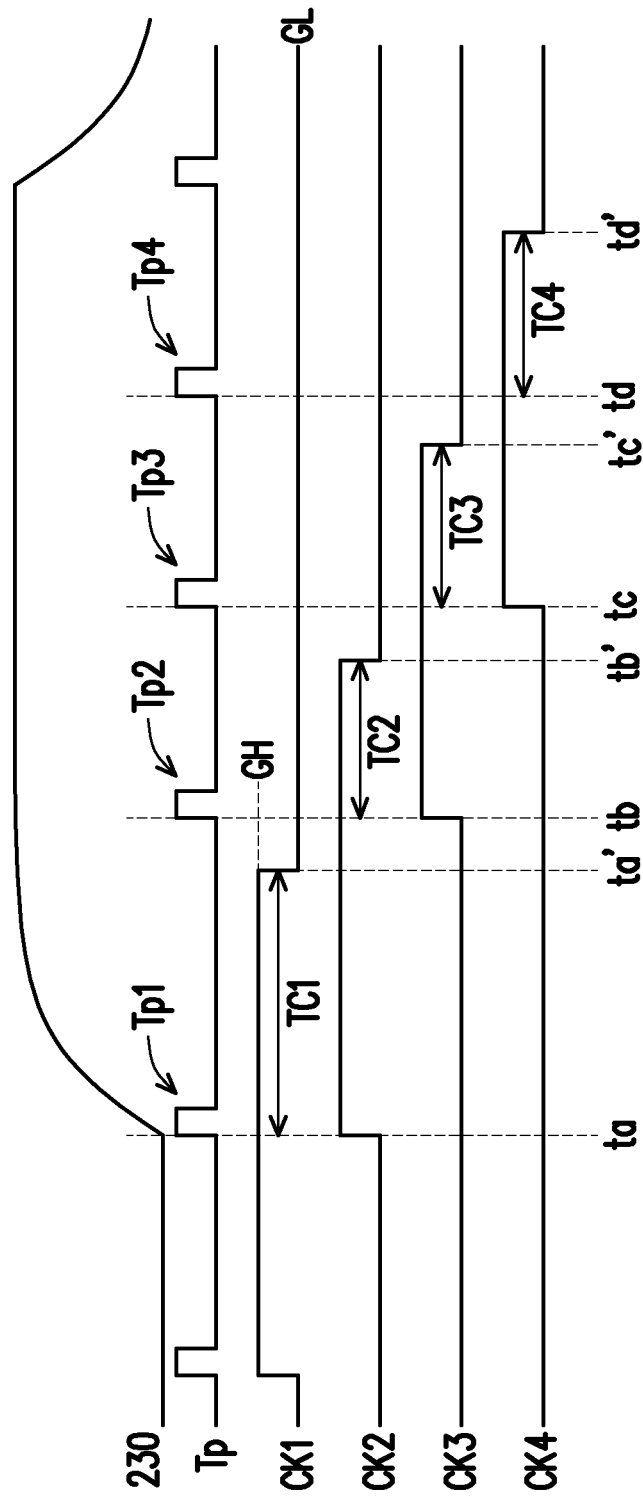
FIG. 5 is a schematic diagram of a driving waveform of an electronic device of an embodiment of the disclosure.

FIG. 5 is a schematic diagram of a driving waveform of an electronic device of an embodiment of the disclosure. In FIG. 5, the data signal waveform 232 is provided by the data driving circuit 130 to the data line DL in FIG. 3. A trigger waveform Tp may be used to trigger the output of the data signal to control when the corresponding signal is provided to the data line DL in FIG. 3. A first gate signal waveform CK1, a second gate signal waveform CK2, a third gate signal waveform CK3, and a fourth gate signal waveform CK4 are provided to the first gate line G1, the second gate line G2, the third gate line G3, and the fourth gate line G4 in FIG. 3 via the gate driving circuit 120. Please refer to FIG. 3 and FIG. 5 at the same time, according to a trigger signal Tp1 of the trigger waveform Tp, the data signal to be written into the first pixel unit P1 is provided to the data line DL from time ta until the first gate signal waveform CK1 is dropped from the high level GH to the low level GL. However, before the time ta, the first gate line G1 has started to be input with the high level GH. From time ta to time ta', the active component of the first pixel unit P1 may be actually turned on to allow the data signal on the data line DL to be written into the first pixel unit P1. Therefore, time ta to time ta' may be regarded as an effective charging time TC1 of the first pixel unit P1. Similarly, according to trigger signals Tp2, Tp3, and Tp4 of the trigger waveform Tp, an effective charging time TC2 of the second pixel unit P2 is from time tb to time tb', an effective charging time TC3 of the third pixel unit P3 is from time tc to time tc', and an effective charging time TC4 of the fourth pixel unit P4 is from time td to time td'. In some embodiments, the output time of the trigger signals Tp1, Tp2, Tp3, and Tp4 may be adjusted to adjust the length of the effective charging time. For example, if the first pixel unit P1 and the previous pixel unit (not shown) are input with data signals of different polarities, Tp2/Tp3/Tp4 may be delayed and the charging time TC2/TC3/TC4 thereof may be shortened, so as to prolong TC1 to ensure that the written signal of the first pixel unit P1 is as expected. In this way, bright streaks or dark streaks due to polarity conversion may be alleviated. Thus, the effective charging time TC1 of the first pixel unit P1 is longer than the effective charging time TC2 of the second pixel unit P2, the effective charging time TC3 of the third pixel unit P3, and the effective charging time TC4 of the fourth pixel unit P4. In the embodiments of FIG. 1 and FIG. 2, the effective charging time of different pixel units P may also be adjusted in a manner similar to that of FIG. 5. Additionally, time ta' and time tb may be the same in some embodiments, and similarly, time tb' and time tc may be the same, and time tc' and time td may be the same.

Figure 6:
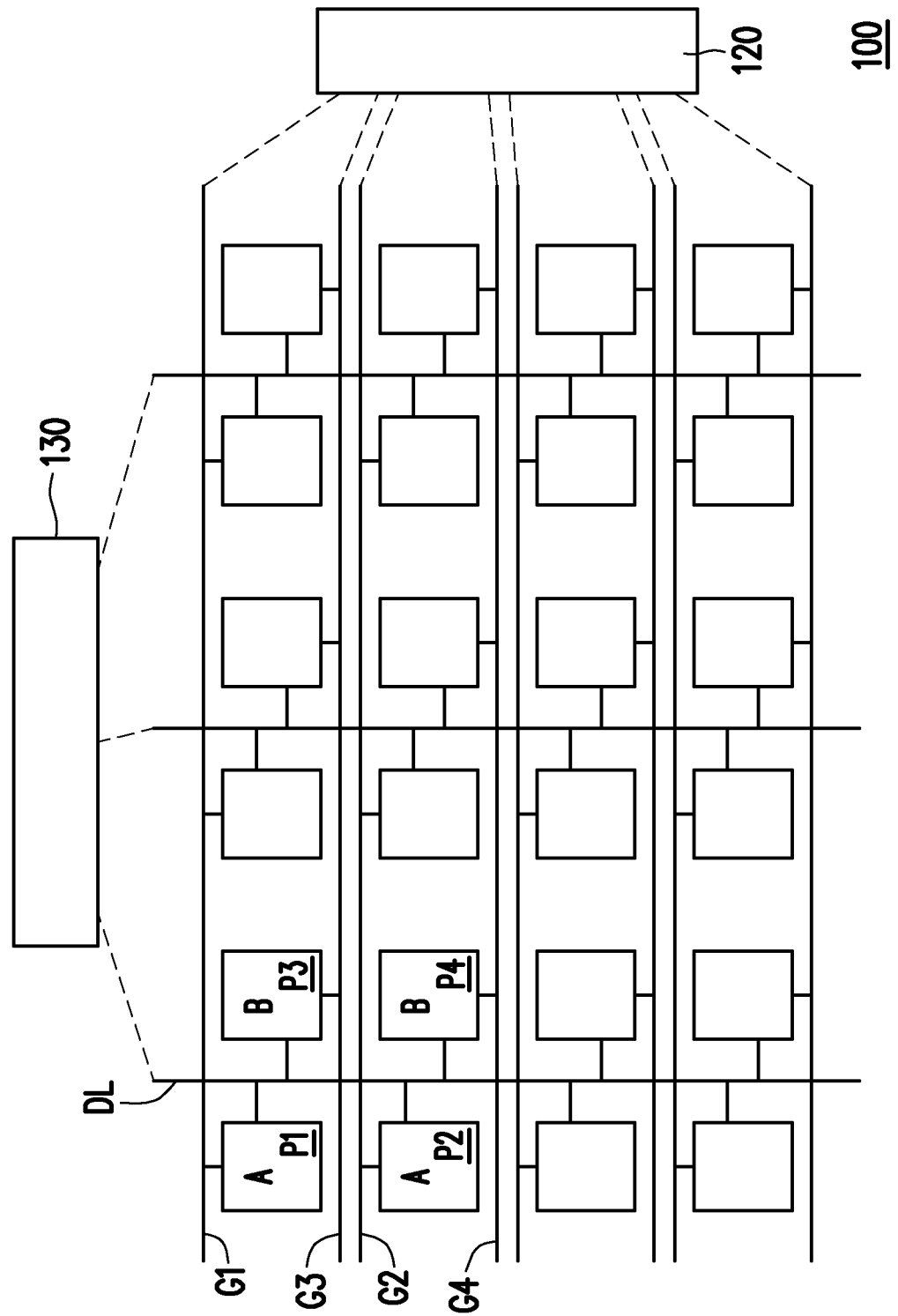
FIG. 6 and FIG. 7 are a schematic diagram and a driving waveform diagram of an electronic device of an embodiment of the disclosure.

FIG. 6 and FIG. 7 are a schematic diagram and a driving waveform diagram of an electronic device of an embodiment of the disclosure. The electronic device 100 of FIG. 6 is substantially similar to the electronic device 100 of FIG. 1, but FIG. 6 shows a schematic diagram of the electronic device 100 driven by the driving waveform of FIG. 7. The same components in the two embodiments are all represented by the same reference numerals, and are not repeated herein. The present embodiment is different from the embodiments of FIG. 1 and FIG. 2 in that, a first gate signal waveform 322, a second gate signal waveform 324, a third gate signal waveform 326, and a fourth gate signal waveform 328 are provided by the gate driving circuit 120 and the data signal waveform 332 is provided by the data driving circuit 130. Specifically, the first gate signal waveform 322, the second gate signal waveform 324, the third gate signal waveform 326, and the fourth gate signal waveform 328 are oscillated between the high level GH and the low level GL, respectively. A first gate driving signal 322H having the high level GH may turn on the active component of the first pixel unit P1, a second gate driving signal 324H having the high level GH may turn on the active component of the second pixel unit P2, a third gate driving signal 326H having the high level GH may turn on the active component of the third pixel unit P3, and a fourth gate driving signal 328H having the high level GH may turn on the active component of the fourth pixel unit P4. In the picture period, the first driving time GT1 of the first gate driving signal 322H is synchronized with the second driving time GT2 of the second gate driving signal 324H, and the third driving time GT3 of the third gate driving signal 326H is synchronized with the fourth driving time GT4 of the fourth gate driving signal 328H. In some embodiments, the so-called synchronization may be understood as the first driving time GT1 and the second driving time GT2 and/or the third driving time GT3 and the fourth driving time GT4 are largely overlapped, such as 90% or more overlapped. In some embodiments, the so-called synchronization may be understood as the first driving time GT1 and the second driving time GT2 are almost completely overlapped and/or the third driving time GT3 and the fourth driving time GT4 are almost completely overlapped. In some embodiments, the so-called synchronization may be understood as the overlapping time of the first driving time GT1 and the second driving time GT2 and/or the third driving time GT3 and the fourth driving time GT4 is greater than the non-overlapping time thereof.

The data signal waveform 332 includes a first data signal 332A and a second data signal 332B. During the first driving time GT1 and the second driving time GT2, time t1 to time t2 may be pre-scanning time and time t2 to time t3 may be charging (writing) time. During time t2 to time t3, the first data signal 332A is provided to the data line DL. Therefore, the first pixel unit P1 and the second pixel unit P2 may be written with the same data signal, such as the first data signal 332A, and have a level A. Similarly, during the third driving time GT3 and the fourth driving time GT4, time t2 to time t3 may be pre-scanning time and time t3 to time t4 may be charging (writing) time. From time t3 to time t4, the second data signal 332B is provided to the data line DL. Therefore, the third pixel unit P3 and the fourth pixel unit P4 may be written with the same data signal, such as the second data signal 332B, and have a level B. The level A and the level B may be the same or different. In the case where the level A and the level B are different, the level A may be greater or less than the level B, and there is no limitation. In the present embodiment, the first driving time GT1 is synchronized with the second driving time GT2 and the third driving time GT3 is synchronized with the fourth driving time GT4, so that two pixel units having the same color are updated synchronously and display the same picture information, thus helping to speed up the update rate. Compared with the method in which each of the pixel units is updated one by one, the update rate of the present embodiment may be substantially doubled, thus facilitating the application of the electronic device 100 to gaming equipment (such as gaming machine screens, gaming machines), but not limited thereto. In some embodiments, as shown in FIG. 6 and FIG. 7, the first pixel unit P1 and the second pixel unit P2 may be the same color, the third pixel unit P3 and the fourth pixel unit P4 may be the same color, and the first pixel unit P1 and the third pixel unit P3 may be different colors. The same first data signal 332A is written into the first pixel unit P1 and the second pixel unit P2, and when the same second data signal 332B is written into the third pixel unit P3 and the fourth pixel unit P4, the update rate may be doubled.

In some embodiments, the electronic device may include an array substrate (for example, any of the above array substrates), an opposite substrate opposite to the array substrate, and a display layer disposed between the array substrate and the opposite substrate. The components on the array substrate and the opposite substrate may be used to drive the display layer to achieve the display effect, and some components may also be used to define light-shielding areas and non-light-shielding areas, which may be called light-shielding layers. In some embodiments, the light-shielding layer does not necessarily have an opaque material, but may achieve an opaque effect by driving. The light-shielding layer may be used to block unwanted components and may also be used to define the display area. Therefore, the layout design of the light-shielding layer may affect the display aperture ratio and/or display effect of the electronic device.

Figure 8:
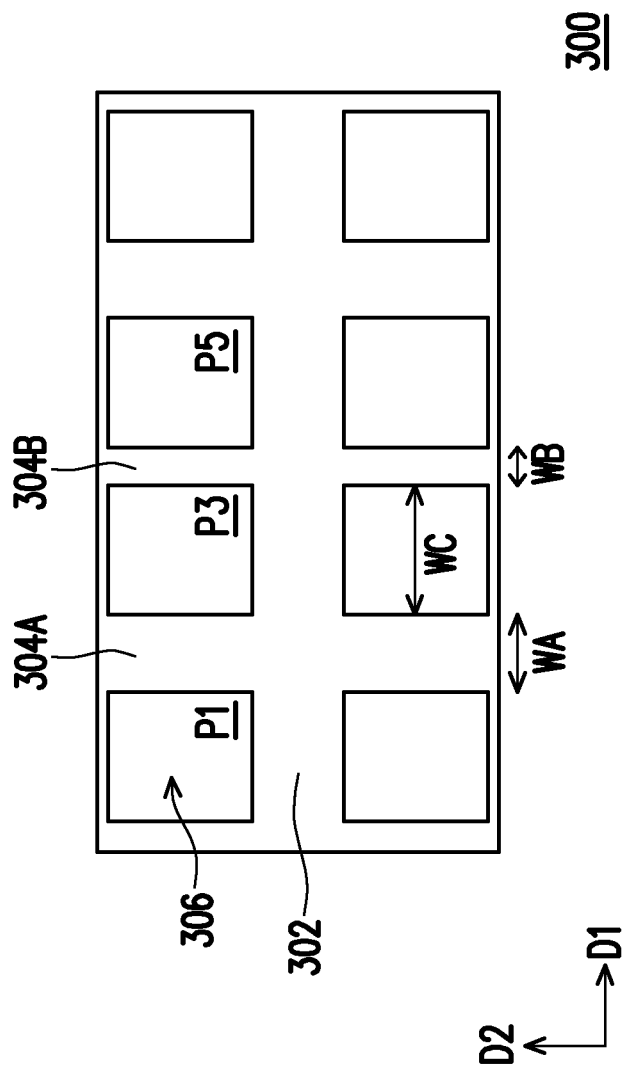
FIG. 8 is a schematic partial top view of a light-shielding layer of an electronic device of an embodiment of the disclosure.

FIG. 8 is a schematic partial top view of a light-shielding layer of an electronic device of an embodiment of the disclosure. For the convenience of description and the simplicity of the drawings, FIG. 8 does not specifically show the individual components of the array substrate 110 and the opposite substrate, but schematically shows the layout of the light-shielding layer. The electronic device of FIG. 8 includes a light-shielding layer 300, wherein the area shown in FIG. 8 substantially corresponds to a portion 100A of the array substrate 110 in FIG. 1. In FIG. 8, the light-shielding layer 300 may have a lateral light-shielding area 302, a first longitudinal light-shielding area 304A, and a second longitudinal light-shielding area 304B. The lateral light-shielding area 302, the first longitudinal light-shielding area 304A, and the second longitudinal light-shielding area 304B may enclose a plurality of opening areas 306 to serve as display or light-emitting areas. The lateral light-shielding area 302, the first longitudinal light-shielding area 304A, and the second longitudinal light-shielding area 304B are areas with low light transmittance, and the opening areas 306 are areas with high light transmittance.

The light-shielding layer 300 may be disposed in the electronic device 100 of FIG. 1. At this time, the relationship between the light-shielding layer 300 and each of the components on the array substrate 110 is as follows, but not limited thereto. Each of the opening areas 306 may define, for example, the display area of each of the pixel units P in FIG. 1. The lateral light-shielding region 302 is substantially overlapped with the gate lines (e.g., the second gate line G2 and the third gate line G3) of FIG. 1 and extended along the first direction D1. The first longitudinal light-shielding area 304A is substantially overlapped with the data line DL of FIG. 1 and extended along the second direction D2. The first direction D1 and the second direction D2 may be intersected with each other. The second longitudinal light-shielding area 304B is substantially overlapped with the area between the third pixel unit P3 and a fifth pixel unit P5 in FIG. 1 and extended along the second direction D2. There may be no data line DL in the area where the second longitudinal light-shielding region 304B is located.

In the present embodiment, the first pixel unit P1, the third pixel unit P3, and the fifth pixel unit P5 are disposed adjacent to each other along the first direction D1, the first light-shielding area 304A is located between the first pixel unit P1 and the third pixel unit P3, and the second light-shielding area 304B is located between the third pixel unit P3 and the fifth pixel unit P5. According to some embodiments, a first width WA of the first light-shielding area 304A is greater than a second width WB of the second light-shielding region 304B. The width of the light-shielding layer 300 in the longitudinal light-shielding area in the present embodiment may be the size of the light-shielding layer 300 measured along the first direction D1. In some embodiments, the first width WA and the second width WB may be, for example, between 5 microns and 30 microns, respectively. In addition, the first longitudinal light-shielding area 304A may be wider than the data line DL to shield the data line. In some embodiments, the first width WA of the light-shielding layer 300 in the first longitudinal light-shielding area 304A may be greater than the second width WB of the second longitudinal light-shielding area 304B. The second width WB of the light-shielding layer 300 in the second longitudinal light-shielding region 304B is relatively narrower, thus helping to increase the area where the opening areas 306 may be disposed in the whole electronic device. Therefore, the design of the light-shielding layer 300 having light-shielding areas of different widths helps to maintain a sufficient aperture ratio. In some embodiments, the difference between the first width WA and the second width WB may be greater than 10% of the first width WA, but not limited thereto. In some embodiments, the light-shielding layer 300 has light-shielding areas having different widths in different areas, but widths WC of the plurality of opening areas 306 defined by the light-shielding layer 300 may be the same size. As shown in FIG. 8, the electronic device may be observed in the top view when the electronic device is lit. The areas having display and light emission are the opening areas 306, and the areas without display and light emission are the light-shielding areas. In the top view, the first width WA of the first light-shielding area 304A and the second width WB of the second light-shielding area 304B may be measured.

FIG. 9 to FIG. 12 are partial cross-sectional views of electronic devices of several embodiments, wherein FIG. 9 to FIG. 12 show some of the members of the electronic devices for illustration, and the electronic devices may include other members not shown in the figures. The cross-sectional structures of FIG. 9 to FIG. 12 may correspond to the embodiments of the electronic device 100 along line I-I in FIG. 1. Therefore, in the following description, the reference numerals of some members are as provided for FIG. 1. Moreover, the first direction D1, the second direction D2, and the third direction D3 in FIG. 9 to FIG. 12 are used to understand the arrangement orientation of each of the members in the electronic device, and the first direction D1, the second direction D2, and the third direction D may be perpendicular to each other, but not limited thereto.

Figure 9:
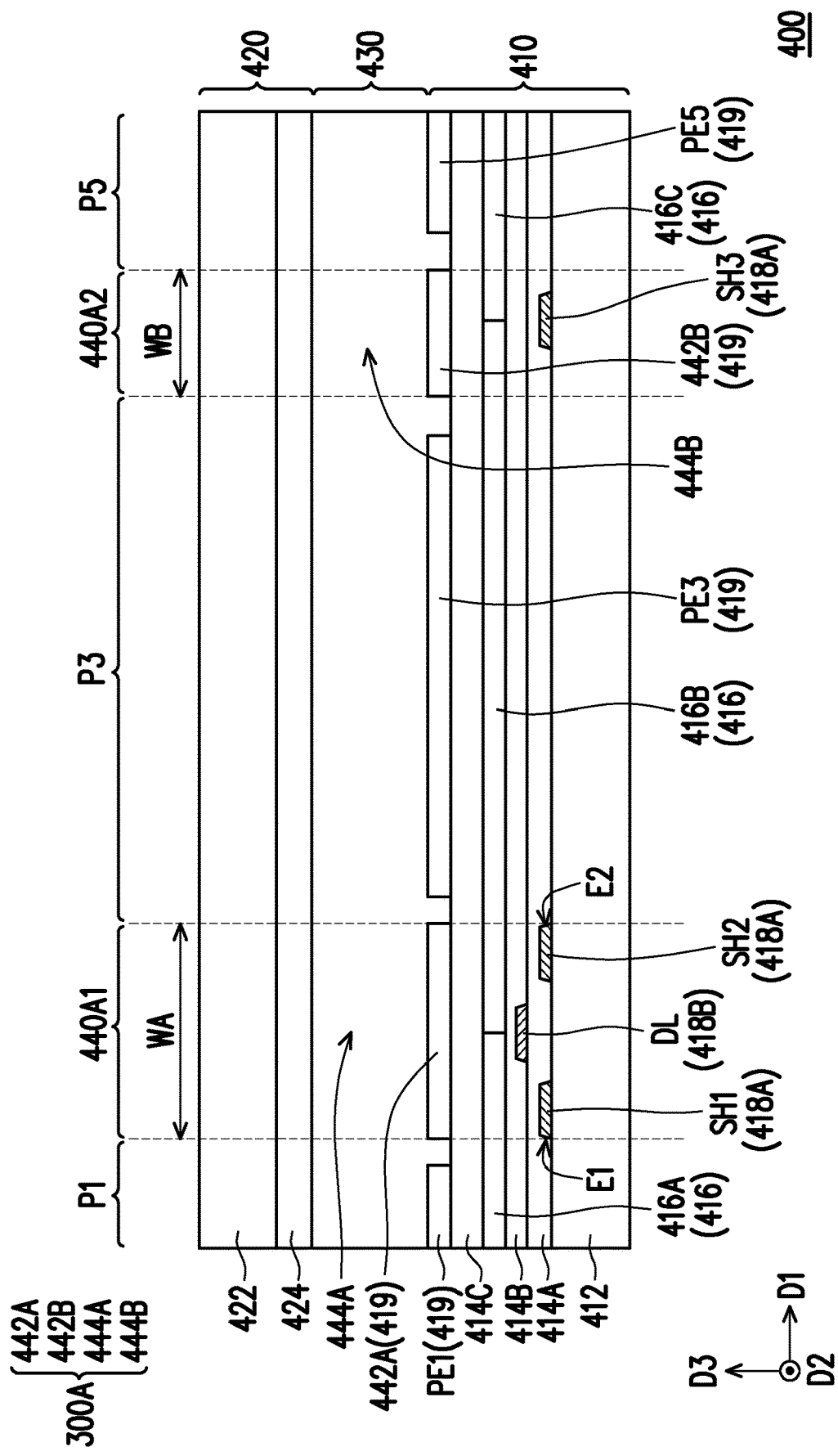
FIG. 9 to FIG. 12 are partial cross-sectional schematic diagrams of electronic devices of a plurality of embodiments of the disclosure.

In FIG. 9, an electronic device 400 includes an array substrate 410, an opposite substrate 420, and a display layer 430, and the display layer 430 is located between the array substrate 410 and the opposite substrate 420. The array substrate 410 at least includes a substrate 412, a plurality of insulating layers 414A to 414C, a color filter layer 416, at least two metal layers 418A and 418B, and a transparent conductive layer 419. The insulating layers 414A to 414C are disposed on the substrate 412 in sequence, and are used for at least separating and protecting the two metal layers 418A and 418B. For example, the metal layer 418A is disposed between the substrate 412 and the insulating layer 414A, and the metal layer 418B is disposed between the insulating layer 414A and the insulating layer 414B. In addition, the color filter layer 416 is disposed between the insulating layer 414B and the insulating layer 414C, and the transparent conductive layer 419 is disposed on the insulating layer 414C. The metal layer 418A and the metal layer 418B may be used to form conductor circuits and conductor members in the array substrate 410. For example, the metal layer 418A may include shielding lines SH1 to SH3 and the like, and the metal layer 418B may include the data line DL and the like. In addition, although not shown in FIG. 9, the metal layer 418A may further include the first gate line G1, the second gate line G2, the third gate line G3, and the fourth gate line G4 in FIG. 1. In some embodiments, the metal layer 418A and the metal layer 418B may be used to form members such as gates, sources, and drains, etc., and/or shared electrodes of the active component.

The array substrate 410 may have a plurality of pixel units, which are respectively the first pixel unit P1, the third pixel unit P3, and the fifth pixel unit P5 arranged along the first direction D1 in FIG. 1. The first pixel unit P1, the third pixel unit P3, and the fifth pixel unit P5 respectively include an active component and a pixel electrode electrically connected to the active component, and FIG. 9 presents a pixel electrode PE1 of the first pixel unit P1, a pixel electrode PE3 of the third pixel unit P3, and a pixel electrode PE5 of the fifth pixel unit P5. The pixel electrode PE1, the pixel electrode PE3, and the pixel electrode PE5 are formed of the same film layer, e.g., the transparent conductive layer 419. The color filter layer 416 includes a first color pattern 416A, a second color pattern 416B, and a third color pattern 416C corresponding to different pixel units. The first color pattern 416A is overlapped with the pixel electrode PE1 and may be used to determine the color of the first pixel unit P1. The second color pattern 416B is overlapped with a pixel electrode PE2 and may be used to determine the color of the second pixel unit P2. The third color pattern 416C is overlapped with the pixel electrode PE3 and may be used to determine the color of the third pixel unit P3. The colors of the first color pattern 416A, the second color pattern 416B, and the third color pattern 416C may be red, green, and blue, respectively, but not limited thereto.

In the present embodiment, the data line DL is located between the pixel electrode PE1 and the pixel electrode PE3, that is, located between the first pixel unit P1 and the third pixel unit P3, and is used for providing corresponding data signals to the first pixel unit P1 and the third pixel unit P3. The projection of the shielding line SH1 on the substrate 412 may be located between the projection of the pixel electrode PE1 on the substrate 412 and the projection of the data line DL on the substrate 412, and the projection of the shielding line SH2 on the substrate 412 is located between the projection of the pixel electrode PE2 on the substrate 412 and the projection of the data line DL on the substrate 412. In this way, the shielding line SH1 and the shielding line SH2 may provide a signal shielding effect, thereby reducing the influence of the signal of the data line DL on the signal of the pixel electrode PE1 and the pixel electrode PE3. Moreover, there is no data line between the pixel electrode PE3 and the pixel electrode PE5, and the projection of the shielding line SH3 on the substrate 412 is located between the projection of the pixel electrode PE3 on the substrate 412 and the projection of the pixel electrode PE5 on the substrate 412.

The opposite substrate 420 may include a substrate 422 and an opposite electrode 424 disposed between the substrate 422 and the display layer 430. When the electronic device 400 displays a picture, the pixel electrode PE1, the pixel electrode PE3, and the pixel electrode PE5 may be written with corresponding data signals, and the opposite electrode 424 may be written with a shared signal, in order to generate a driving electric field for driving the display layer 430, so that the first pixel unit P1, the third pixel unit P3, and the fifth pixel unit P5 display predetermined brightness.

In addition, the electronic device 400 further includes a light-shielding layer 300A. The light-shielding layer 300A includes a light-shielding area electrode 442A, a light-shielding area electrode 442B, a light-shielding area display portion 444A, and a light-shielding area display portion 444B. The film layers of the light-shielding area electrode 442A and the light-shielding area electrode 442B are the same as the film layers of the pixel electrode PE1, the pixel electrode PE3, and the pixel electrode PE5, which are all transparent conductive layers 419. The light-shielding area display portion 444A and the light-shielding area display portion 444B are the portions of the display layer 430 overlapped with the light-shielding area electrode 442A and the light-shielding area electrode 442B, respectively.

When the electronic device 400 displays a picture, a shared signal is written into the opposite electrode 424 and the shared signal is also written into the light-shielding area electrode 442A and the light-shielding area electrode 442B, so that both sides of the light-shielding area display portion 444A and the light-shielding area display portion 444B are made to have the same voltage level. When the display layer 444 includes liquid crystal molecules, since both the light-shielding area electrode 442A and the opposite electrode 424 have the same signal, the liquid crystal molecules in the light-shielding area display portion 444A are not tilted or rotated to form a light-tight first light-shielding area 440A1. Similarly, the light-shielding area electrode 442B and the opposite electrode 424 both have the same signal, so that the light-shielding area display portion 444B is not tilted or rotated to form a light-tight second light-shielding area 440A2. Therefore, the light-shielding area electrode 442A and the light-shielding area electrode 442B themselves are transparent, but may be used to define the first light-shielding area 440A1 and the second light-shielding area 440A2 respectively.

The first light-shielding area 440A1 is located between the first pixel unit P1 and the third pixel unit P3, and the second light-shielding area 440A2 is located between the third pixel unit P3 and the fifth pixel unit P5. For example, the first light-shielding area 440A1 has a sufficient width to shield the data line DL. In some embodiments, the light-shielding layer 300A may be applied in the embodiment of FIG. 8 to implement the light-shielding layer 300. In this way, the first width WA of the first light-shielding area 440A1 may be greater than the second width WB of the second light-shielding area 440A2. In the present embodiment, the width of the light-shielding area electrode 442A may be greater than, less than, or equal to the width occupied by the shielding line SH1 and the shielding line SH2. The first width WA may be the width of the light-shielding area electrode 442A, or the width occupied by the shielding line SH1 and the shielding line SH2, whichever is greater. For example, in FIG. 9, the edge of the light-shielding area electrode 442A may be located above the shielding line SH1 and the shielding line SH2, that is, the width of the light-shielding area electrode 442A may be less than the width occupied by an outer edge E1 of the shielding line SH1 and an outer edge E2 of the shielding line SH2. Therefore, the first width WA may be the width between the outer edge E1 of the shielding line SH1 and the outer edge E2 of the shielding line SH2. The width of the light-shielding area electrode 442B may be greater than, less than, or equal to the width of the shielding line SH3. The second width WB may be the width of the light-shielding area electrode 442B or the width of the shielding line SH3, whichever is greater.

Figure 10:
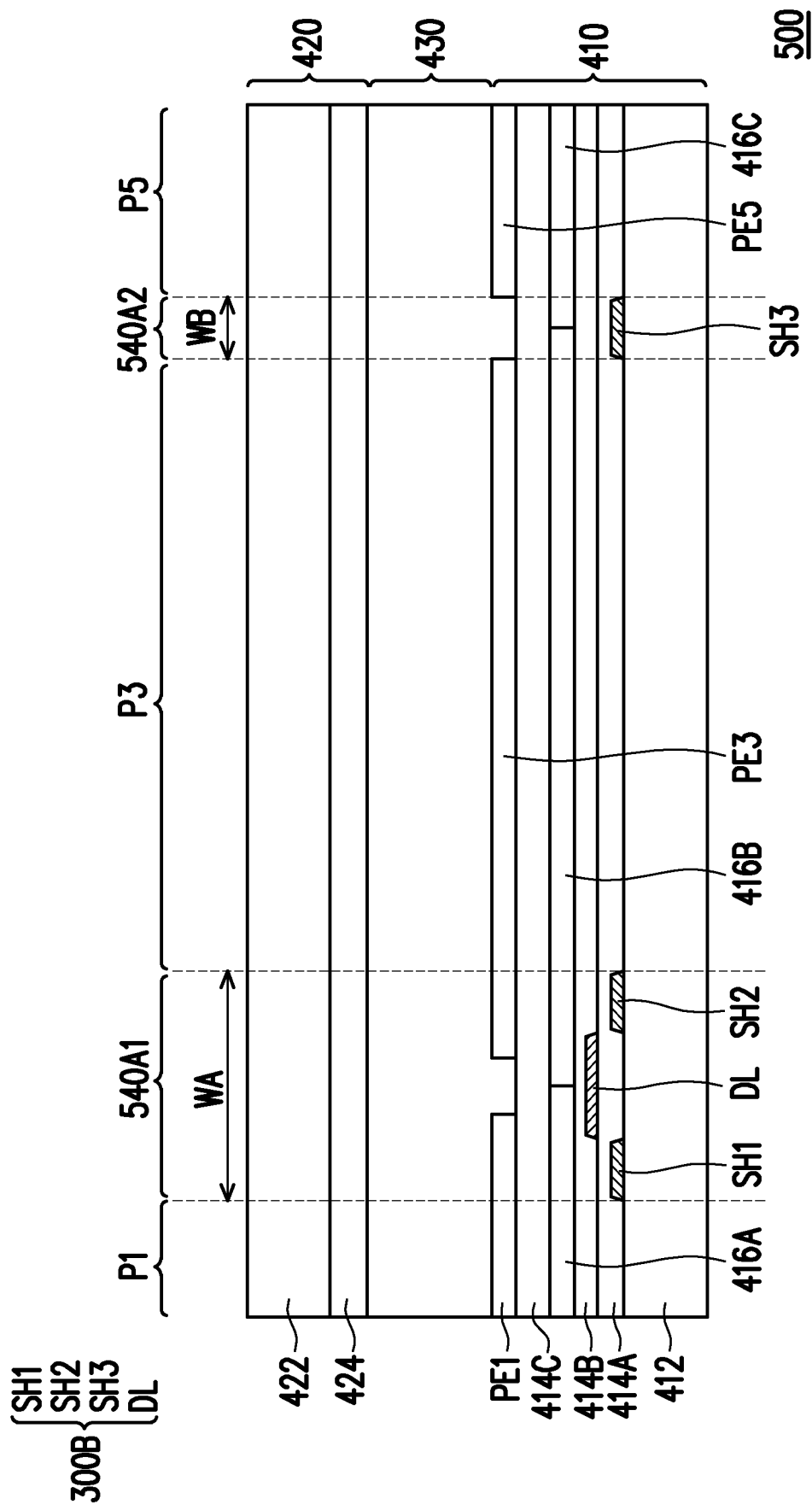

An electronic device 500 of FIG. 10 is substantially similar to the electronic device 400 of FIG. 9. Therefore, FIG. 10 adopts the reference numerals of FIG. 9, and the same reference numerals in the two embodiments represent the same members and may be mutually referenced. The electronic device 500 of FIG. 10 includes the array substrate 410, the opposite substrate 420, and the display layer 430 located between the array substrate 410 and the opposite substrate 420. The main difference between the electronic device 500 and the electronic device 400 is that the electronic device 500 omits the light-shielding area electrode 442A and the light-shielding area electrode 442B in FIG. 4. However, the data line DL, the shielding line SH1, the shielding line SH2, and the shielding line SH3 of the electronic device 500 provide the function of shielding light to define a light-shielding area 540A1 and a light-shielding area 540A2. In other words, the data line DL, the shielding line SH1, the shielding line SH2, and the shielding line SH3 form a light-shielding layer 300B in the electronic device 500. In the present embodiment, the widths of the data line DL, the shielding line SH1, and the shielding line SH2 may be designed in a way that the projection of the data line DL on the substrate 412 may be overlapped with or connected to the projections of the shielding line SH1 and the shielding line SH2 on the substrate 412, so that the light-shielding area 540A1 may be defined. Similar to the above embodiments, the light-shielding area 540A1 of the light-shielding layer 300B between the first pixel unit P1 and the third pixel unit P3 has the first width WA, and the light-shielding area 540A2 of the light-shielding layer 300B between the third pixel unit P3 and the fifth pixel unit P5 has the second width WB, and the first width WA is greater than the second width WB.

Figure 11:
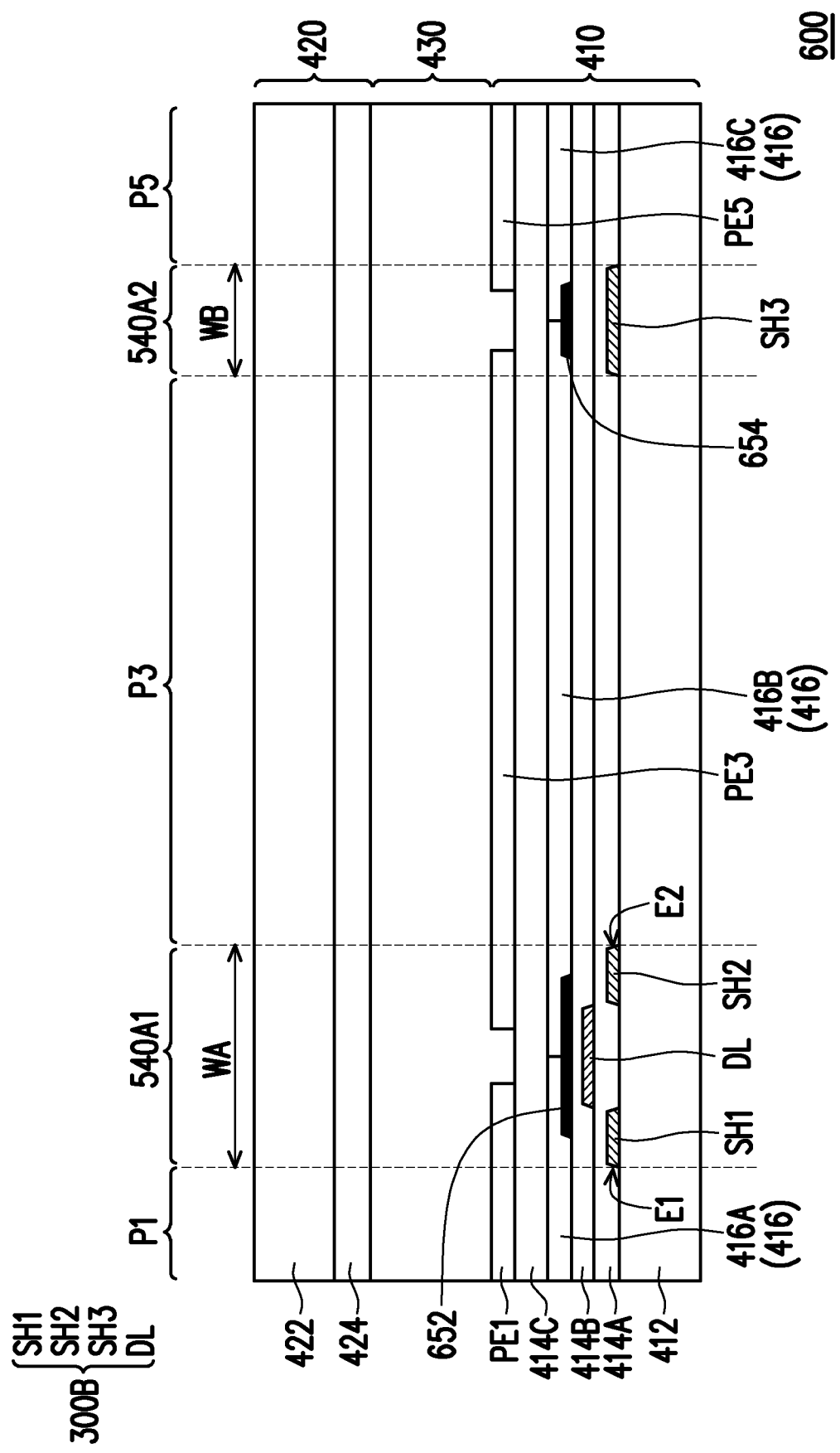

An electronic device 600 of FIG. 11 is substantially similar to the electronic device 500 of FIG. 10. Therefore, FIG. 11 adopts the reference numerals of FIG. 10, and the same reference numerals in the two embodiments represent the same members and may be mutually referenced. The electronic device 600 of FIG. 11 includes the array substrate 410, the opposite substrate 420, and the display layer 430 located between the array substrate 410 and the opposite substrate 420. At the same time, the electronic device 600 includes the light-shielding layer 300B formed by the data line DL, the shielding line SH1, the shielding line SH2, and the shielding line SH3. In the present embodiment, the array substrate 410 further includes a light-shielding pattern 652 and a light-shielding pattern 654. In the present embodiment, the light-shielding pattern 652 and the light-shielding pattern 654 may be located in the light-shielding area 540A1 and the light-shielding area 540A2, respectively, wherein the light-shielding area 540A1 is defined by the data line DL, the shielding line SH1, and the shielding line SH2, and the light-shielding area 540A2 is defined by the shielding line SH3. That is to say, the implementation of the light-shielding area 540A1 and the light-shielding area 540A2 of the electronic device 600 is substantially similar to that of the electronic device 500 of FIG. 10. Moreover, the light-shielding pattern 652 is disposed between the first color pattern 416A and the second color pattern 416B of the color filter layer 416, and the light-shielding pattern 654 is disposed between the second color pattern 416B and the third color pattern 416C of the color filter layer 416. The colors of the first color pattern 416A, the second color pattern 416B, and the third color pattern 416C are different from each other. Therefore, the light-shielding pattern 652 may prevent the color mixing of the first color pattern 416A and the second color pattern 416B, and the light-shielding pattern 654 may prevent the color mixing of the second color pattern 416B and the third color pattern 416C. In the present embodiment, the width of the light-shielding pattern 652 may be greater than, less than, or equal to the width occupied by the shielding line SH1 and the shielding line SH2. The first width WA may be the width of the light-shielding pattern 652, or the width occupied by the shielding line SH1 and the shielding line SH2, whichever is greater. For example, in FIG. 11, the first width WA may be the width between the outer edge E1 of the shielding line SH1 and the outer edge E2 of the shielding line SH2. The width of the light-shielding pattern 654 may be greater than, less than, or equal to the width of the shielding line SH3. The second width WB may be the width of the light-shielding pattern 654 or the width of the shielding line SH3, whichever is greater.

Figure 12:
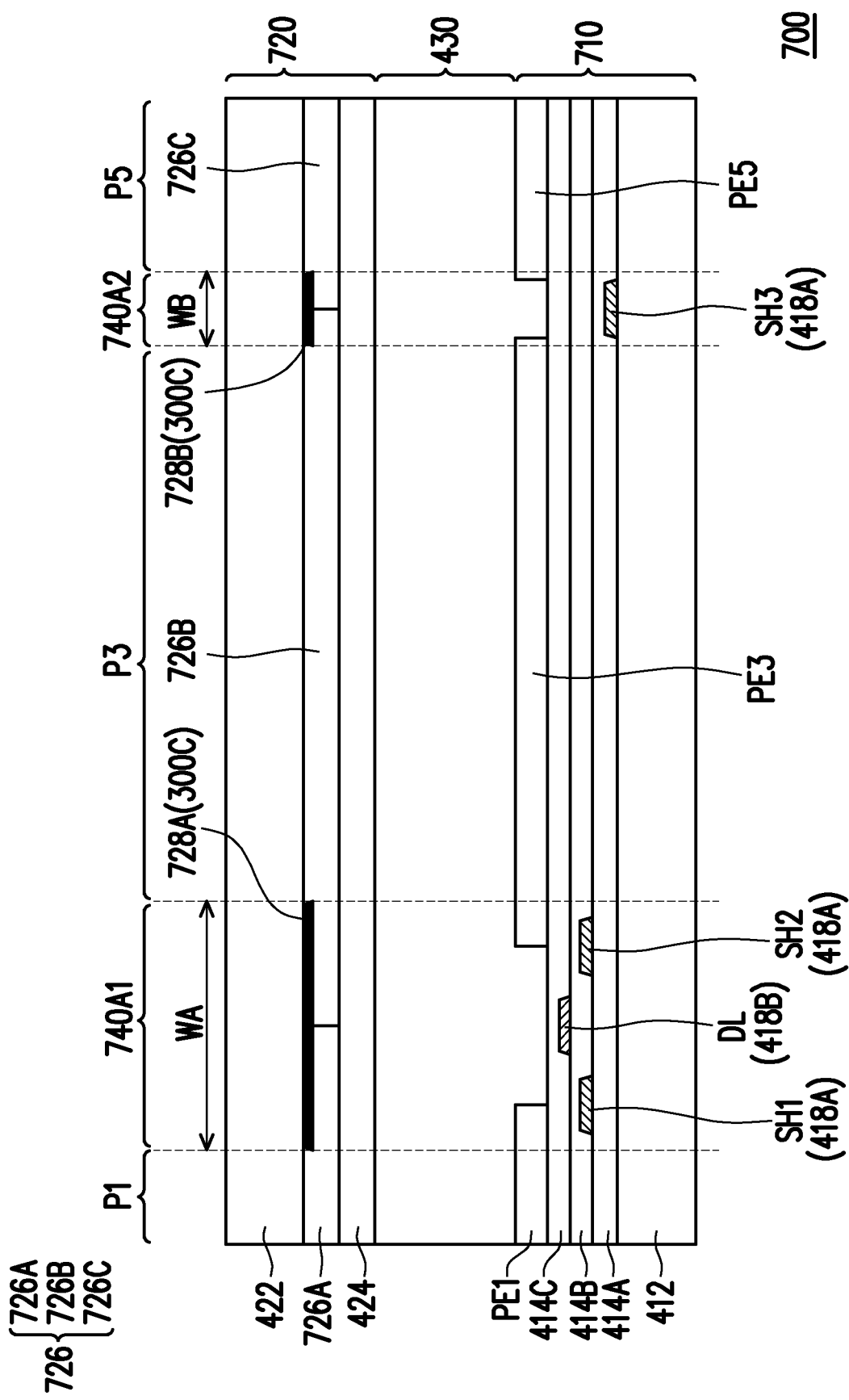

An electronic device 700 of FIG. 12 includes an array substrate 710, an opposite substrate 720, and the display layer 430 located between the array substrate 710 and the opposite substrate 720. Some members of the electronic device 700 are substantially similar to the embodiment of FIG. 9, so the same reference numerals in the two embodiments may be mutually referenced. The array substrate 710 at least includes the substrate 412, the plurality of insulating layers 414A to 414C, the at least two metal layers 418A and 418B, and the transparent conductive layer 419, wherein the substrate 412, the plurality of insulating layers 414A to 414C, the at least two metal layers 418A and 418B, and the transparent conductive layer 419 are as provided in the description of the electronic device 400 of FIG. 9. The metal layer 418A may include the shielding lines SH1 to SH3, etc., and the metal layer 418B may include the data line DL and the like. Specifically, the array substrate 710 is different from the array substrate 410 of FIG. 9 in that the array substrate 710 does not include a color filter layer. In addition, the opposite substrate 720 includes the substrate 422, the opposite electrode 424, the color filter layer 426, and the light-shielding layer 300C. For example, the color filter layer 726 is disposed between the opposite electrode 424 and the substrate 422, and the light-shielding layer 300C is disposed between the color filter layer 726 and the substrate 422.

In the present embodiment, the color filter layer 726 may include a first color pattern 726A disposed in the first pixel unit P1, a second color pattern 726B disposed in the second pixel unit P2, and a third color pattern 726C disposed in the third pixel unit P3. A first light-shielding pattern 728A of the light-shielding layer 300C is located between the first color pattern 726A and the second color pattern 726B, and a second light-shielding pattern 728B of the light-shielding layer 300C is located between the second color pattern 726B and the third color pattern 726C. The material of the light-shielding layer 300C includes a light-shielding material, such as metal, light-shielding resin, and the like. Therefore, the first light-shielding pattern 728A and the second light-shielding pattern 728B may define a light-shielding area 740A1 and a light-shielding area 740A2, respectively. The first light-shielding pattern 728A is correspondingly located above the data line DL and may shield at least the data line DL. In some embodiments, the light-shielding area 740A1 defined by the first light-shielding pattern 728A has the first width WA, the light-shielding area 740A2 defined by the second light-shielding pattern 728B has the second width WB, and the first width WA is greater than the second width WB. In some embodiments, the size and relative relationship between the first width WA and the second width WB are as provided in the description of the embodiment of FIG. 10, but not limited thereto.

Based on the above, the electronic device according to an embodiment of the disclosure adopts the layout of double gate line sharing data line (2G1D), and the pixel unit is updated by an inverse N-shaped update path. In some embodiments, the two gate lines adjacent to each of the pixel units may provide gate driving signals at non-overlapping driving times, so the parasitic capacitance of the gate lines does not readily affect the level at which each of the pixel units is written, thus alleviating the phenomenon of bright streaks or dark streaks and the like that may not present the expected brightness. In some embodiments, the polarity inversion of the data signal occurs between adjacent pixel units of the same color, rather than in an entire column of pixel units of a particular color. Therefore, the unsatisfactory display brightness that may be caused by the polarity inversion of the signal is not limited to a specific color, thus helping to improve the display effect of the electronic device. In some embodiments, the polarity inversion of the data signal occurs in pixel units with a dot-like distribution, so the unsatisfactory display brightness that may be caused by the polarity inversion of the signal presents a point-like distribution, thus helping to optimize the display effect of the electronic device. In some embodiments, the length of the driving time may be adjusted to improve the display brightness that may be caused by the polarity inversion of the signal. In some embodiments, adjacent pixel units of the same color may have synchronized driving times, which may increase update rate. In some embodiments, the electronic device further includes a light-shielding layer, and the light-shielding layer may have different widths, so as to provide a more flexible layout according to the design of the array substrate.

Based on the above, according to some embodiments, the first gate line and the third gate line are disposed adjacently, and in a time sequence, there is a second gate driving signal between the first gate driving signal and the third gate driving signal. In this way, the parasitic capacitance generated by the third gate line during the first driving time may have less or no influence on the first pixel unit, thereby achieving better display effect.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising:
    an array substrate, the array substrate comprising:
        a first gate line, a second gate line, and a third gate line disposed between the first gate line and the second gate line, wherein the first gate line, the second gate line, and the third gate line extend along a first direction;
        a data line;
        a first pixel unit electrically connected to the first gate line and the data line;
        a second pixel unit electrically connected to the second gate line and the data line;
        a third pixel unit electrically connected to the third gate line and the data line;
        a fifth pixel unit, wherein the first pixel unit, the third pixel unit, and the fifth pixel unit are disposed adjacently along the first direction;
        a gate driving circuit electrically connected to the first gate line, the second gate line, and the third gate line, and providing a first gate driving signal to the first pixel unit, a second gate driving signal to the second pixel unit, and a third gate driving signal to the third pixel unit in a time sequence;
        a first light-shielding area disposed between the first pixel unit and the third pixel unit; and
        a second light-shielding area disposed between the third pixel unit and the fifth pixel unit, wherein a first width of the first light-shielding area is greater than a second width of the second light-shielding area.

2. The electronic device of claim 1, wherein the first pixel unit and the second pixel unit are disposed adjacent to each other along a second direction.

3. The electronic device of claim 1, further comprising a data driving circuit electrically connected to the data line to provide a first data signal to the first pixel unit and provide a second data signal to the second pixel unit, wherein the first data signal and the second data signal have opposite polarities.

4. The electronic device of claim 1, further comprising a data driving circuit electrically connected to the data line to provide a first data signal to the first pixel unit and provide a second data signal to the second pixel unit, wherein the first data signal and the second data signal have the same polarities.

5. The electronic device of claim 1, wherein the first pixel unit and the second pixel unit are of a same color, and the first pixel unit and the third pixel unit are of different colors.

6. The electronic device of claim 1, wherein in a picture period, a first driving time of the first gate driving signal and a third driving time of the third gate driving signal are not overlapped.

7. The electronic device of claim 1, wherein in a picture period, a first driving time of the first gate driving signal and a third driving time of the third gate driving signal are partially overlapped.

8. The electronic device of claim 1, wherein in a picture period, a first driving time of the first gate driving signal and a second driving time of the second gate driving signal are at least partially overlapped.

9. The electronic device of claim 1, wherein the first pixel unit and the third pixel unit are disposed between the first gate line and the third gate line.

10. The electronic device of claim 1, wherein the third gate line and the second gate line are disposed between the first pixel unit and the second pixel unit.

11. The electronic device of claim 1, wherein in a picture period, an overlapping time of a first driving time of the first gate driving signal and a second driving time of the second gate driving signal is greater than a non-overlapping time thereof.

12. The electronic device of claim 1, wherein in a picture period, a second driving time of the second gate driving signal and a third driving time of the third gate driving signal are partially overlapped.

13. An electronic device, comprising:

an array substrate, the array substrate comprising:

a first gate line, a second gate line, and a third gate line disposed between the first gate line and the second gate line, wherein the first gate line, the second gate line, and the third gate line extend along a first direction;

a data line;

a first pixel unit electrically connected to the first gate line and the data line;

a second pixel unit electrically connected to the second gate line and the data line;

a third pixel unit electrically connected to the third gate line and the data line;

a fourth gate line;

a fourth pixel unit electrically connected to the fourth gate line and the data line; and a gate driving circuit electrically connected to the first gate line, the second gate line, and the third gate line, and providing a first gate driving signal to the first pixel unit, a second gate driving signal to the second pixel unit, and a third gate driving signal to the third pixel unit in a time sequence, wherein the second pixel unit and the fourth pixel unit are disposed between the second gate line and the fourth gate line, the gate driving circuit is electrically connected to the fourth gate line to provide a fourth gate driving signal to the fourth pixel unit, and the first pixel unit, the second pixel unit, the third pixel unit, and the fourth pixel unit are updated along an inverse N-shaped path.

14. The electronic device of claim 13, wherein the second gate line and the third gate line are disposed between the fourth pixel unit and the third pixel unit.

15. The electronic device of claim 13, wherein in a picture period, a third driving time of the third gate driving signal and a fourth driving time of the fourth gate driving signal are overlapped by 90% or more.

16. The electronic device of claim 13, wherein in a picture period, an overlapping time of a third driving time of the third gate driving signal and a fourth driving time of the fourth gate driving signal is greater than a non-overlapping time thereof.

17. The electronic device of claim 1, wherein the data line extends along a second direction, and a distance between the third gate line and the second gate line along the second direction is less than a distance between the third gate line and the first gate line along the second direction.

18. The electronic device of claim 13, wherein the fourth pixel unit and the second pixel unit are disposed adjacent to each other along the first direction.

19. The electronic device of claim 13, wherein the data line extends along a second direction, and the fourth pixel unit and the third pixel unit are disposed adjacent to each other along the second direction.

20. The electronic device of claim 19, wherein the third pixel unit and the fourth pixel unit are of a same color.

\* \* \* \* \*